(12) United States Patent
Ghantous

(10) Patent No.: US 7,683,648 B1
(45) Date of Patent: Mar. 23, 2010

(54) INTEGRATED CIRCUIT SOCKET AND METHOD OF USE FOR PROVIDING ADJUSTABLE CONTACT PITCH

(75) Inventor: Farid Gerges Ghantous, San Jose, CA (US)

(73) Assignee: NVIDIA Corporation, Santa Clara, CA (US)

(*) Notice: Subject to any disclaimer, the term of this patent is extended or adjusted under 35 U.S.C. 154(b) by 0 days.

(21) Appl. No.: 11/761,297

(22) Filed: Jun. 11, 2007

(51) Int. Cl.
*G01R 31/02* (2006.01)

(52) U.S. Cl. .................. 324/755; 439/331; 324/158.1

(58) Field of Classification Search ............. 324/158.1, 324/763, 755, 765; 439/73, 331, 341, 620.15
See application file for complete search history.

(56) References Cited

U.S. PATENT DOCUMENTS

| | | | | |
|---|---|---|---|---|
| 4,771,234 A | * | 9/1988 | Cook et al. | 324/754 |
| 4,950,980 A | * | 8/1990 | Pfaff | 324/755 |
| 5,127,837 A | * | 7/1992 | Shah et al. | 439/71 |
| 5,215,472 A | * | 6/1993 | DelPrete et al. | 439/71 |
| 5,306,167 A | * | 4/1994 | Nagumo | 439/226 |
| 5,517,125 A | * | 5/1996 | Posedel et al. | 324/755 |
| 5,955,888 A | * | 9/1999 | Frederickson et al. | 324/761 |
| 6,091,253 A | * | 7/2000 | Huang | 324/758 |
| 6,377,061 B1 | * | 4/2002 | Settle et al. | 324/755 |
| 6,559,665 B1 | * | 5/2003 | Barabi | 324/755 |
| 6,607,396 B1 | * | 8/2003 | Ito | 439/331 |
| 7,335,030 B2 | * | 2/2008 | Kunioka et al. | 439/73 |

* cited by examiner

*Primary Examiner*—Ha Tran T Nguyen
*Assistant Examiner*—Richard Isla Rodas
(74) *Attorney, Agent, or Firm*—Zilka-Kotab, PC

(57) ABSTRACT

An integrated circuit socket apparatus and method of use are provided. Included is a body capable of receiving an integrated circuit including a plurality integrated circuit contacts. Further provided is a bottom adapter assembly removably coupled to the body. The bottom adapter assembly includes a top portion, a bottom portion, and a plurality of pins removably situated between the top portion and the bottom portion of the bottom adapter assembly, for providing electrical communication between the integrated circuit contacts and a plurality of circuit board contacts. Still yet, a coupler is provided which is capable of coupling the top portion and the bottom portion of the bottom adapter assembly when the bottom adapter assembly is removed from the body.

17 Claims, 5 Drawing Sheets

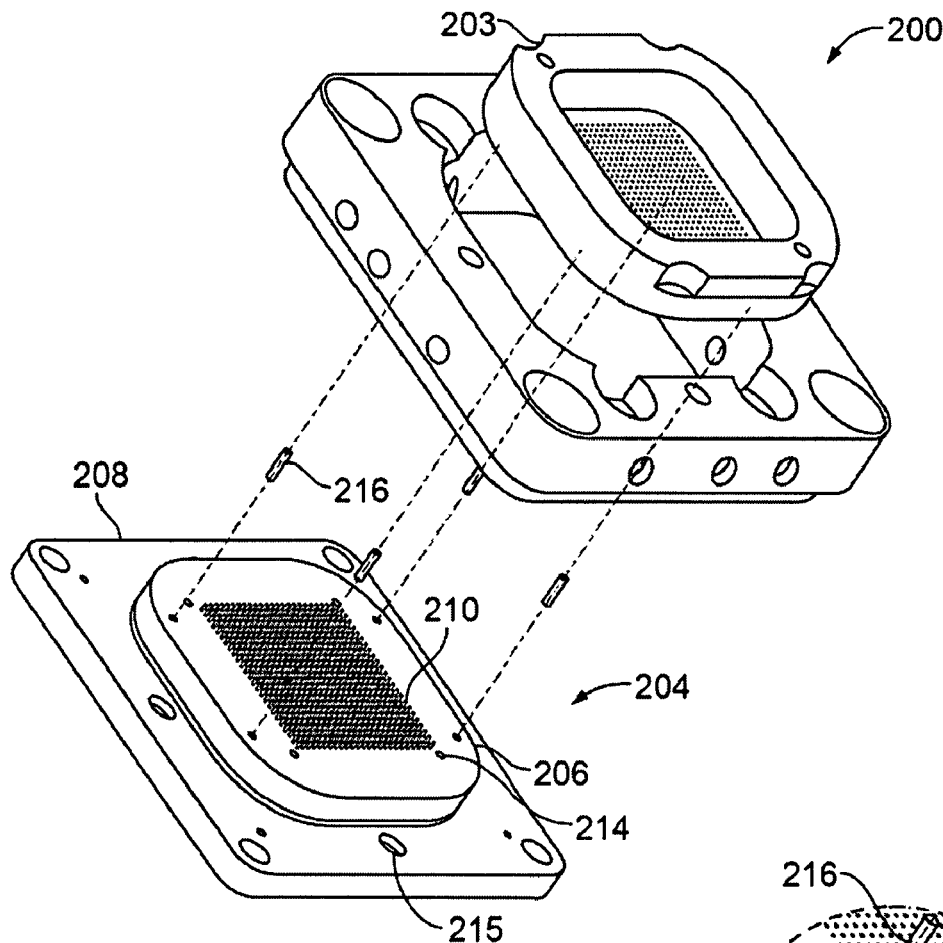
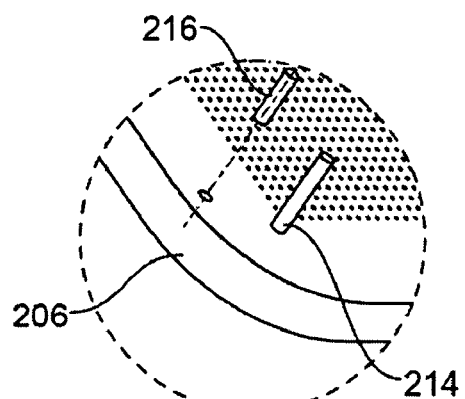
FIG. 4
FIG. 3
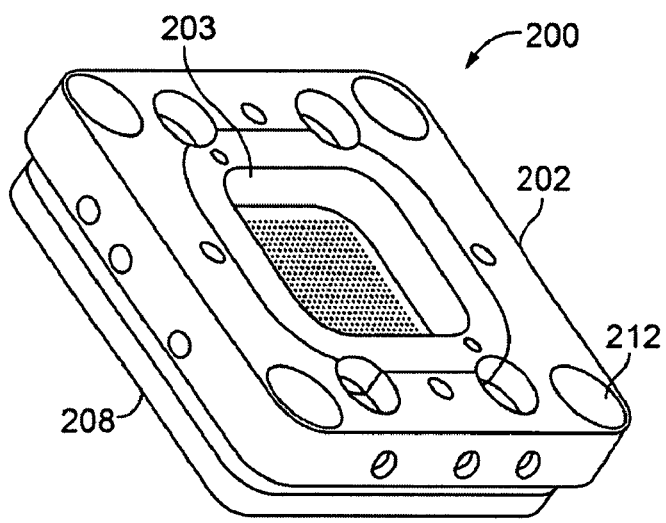
FIG. 5

INTEGRATED CIRCUIT SOCKET AND METHOD OF USE FOR PROVIDING ADJUSTABLE CONTACT PITCH

FIELD OF THE INVENTION

The present invention relates to integrated, circuit sockets, and more particularly to testing integrated circuits using integrated circuit sockets.

BACKGROUND

Prior art FIG. 1 is an exploded view of an integrated circuit socket apparatus 100, in accordance with the prior art. Such integrated circuit socket apparatus 100 includes a body 102 capable of receiving an integrated circuit 104. Further provided is a bottom adapter assembly 106 removably coupled to the body 102.

As shown, the bottom adapter assembly 106 includes a top portion 108, a bottom portion 110, and a plurality of contact pins 112 removably situated between the top portion 108 and the bottom portion 110. In use, the contact pins 112 serve for providing electrical communication between integrated circuit contacts of the integrated circuit 104 and circuit board contacts. As further shown, a plurality of posts 114 are coupled to the body 102 for being frictionally inserted into holes 115 formed in the top portion 108 and the bottom portion 110 of the bottom adapter assembly 106, thus maintaining the bottom adapter assembly 106 coupled to the body 102.

During use, when removal of the bottom adapter assembly 106 from the body 102 is desired, the top portion 108 and the bottom portion 110 of the bottom adapter assembly 106 are disengaged from the posts 114. Unfortunately, when this is done, there is a risk that the top portion 108 and the bottom portion 110 of the bottom adapter assembly 106 may, themselves, be disengaged, thus allowing the contact pins 112 to be inadvertently spilled, etc.

There is thus a need for addressing these and/or other issues associated with the prior art.

SUMMARY

An integrated circuit socket apparatus and method of use are provided. Included is a body capable of receiving an integrated circuit including a plurality integrated circuit contacts. Further provided is a bottom adapter assembly removably coupled to the body. The bottom adapter assembly includes a top portion, a bottom portion, and a plurality of pins removably situated between the top portion and the bottom portion of the bottom adapter assembly, for providing electrical communication between the integrated circuit contacts and a plurality of circuit hoard contacts. Still yet, a coupler is provided which is capable of coupling the top portion and the bottom portion of the bottom adapter assembly when the bottom adapter assembly is removed from the body.

BRIEF DESCRIPTION OF THE DRAWINGS

Prior art

FIG. 3 illustrates a close-up view of the posts and the fasteners in relation to the top portion of the bottom adapter assembly.

FIG. 4 is a partially exploded view of the integrated circuit socket apparatus of FIG. 2 showing the top portion and the bottom portion of the bottom adapter assembly coupled, in accordance with one embodiment.

FIG. 5 is an assembled view of the integrated circuit socket apparatus of FIG. 2 showing the bottom adapter assembly attached to the body, in accordance with one embodiment.

DETAILED DESCRIPTION

Figure 1:
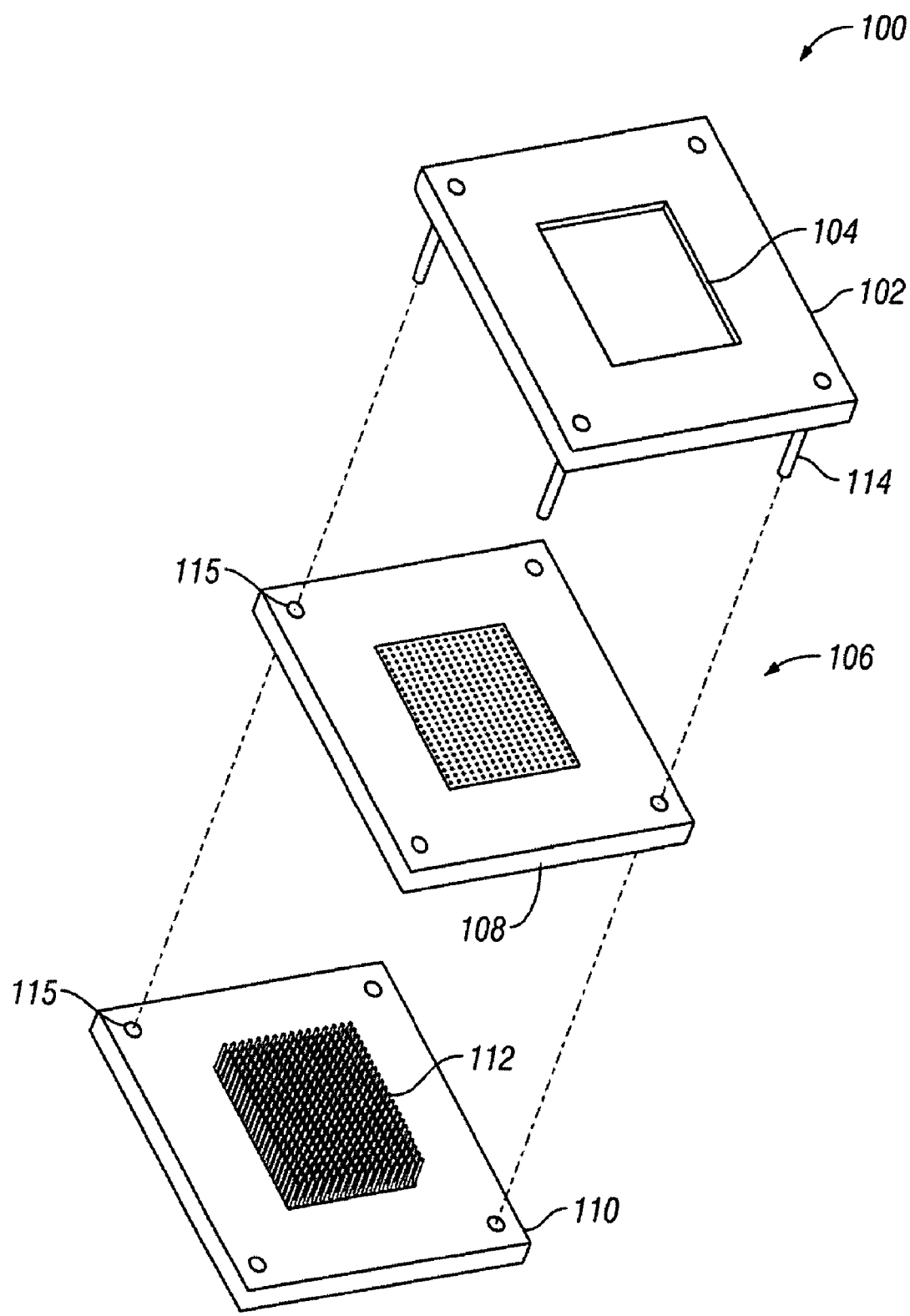
FIG. 1 is an exploded view of an integrated circuit socket apparatus, in accordance with the prior art.
Figure 2:
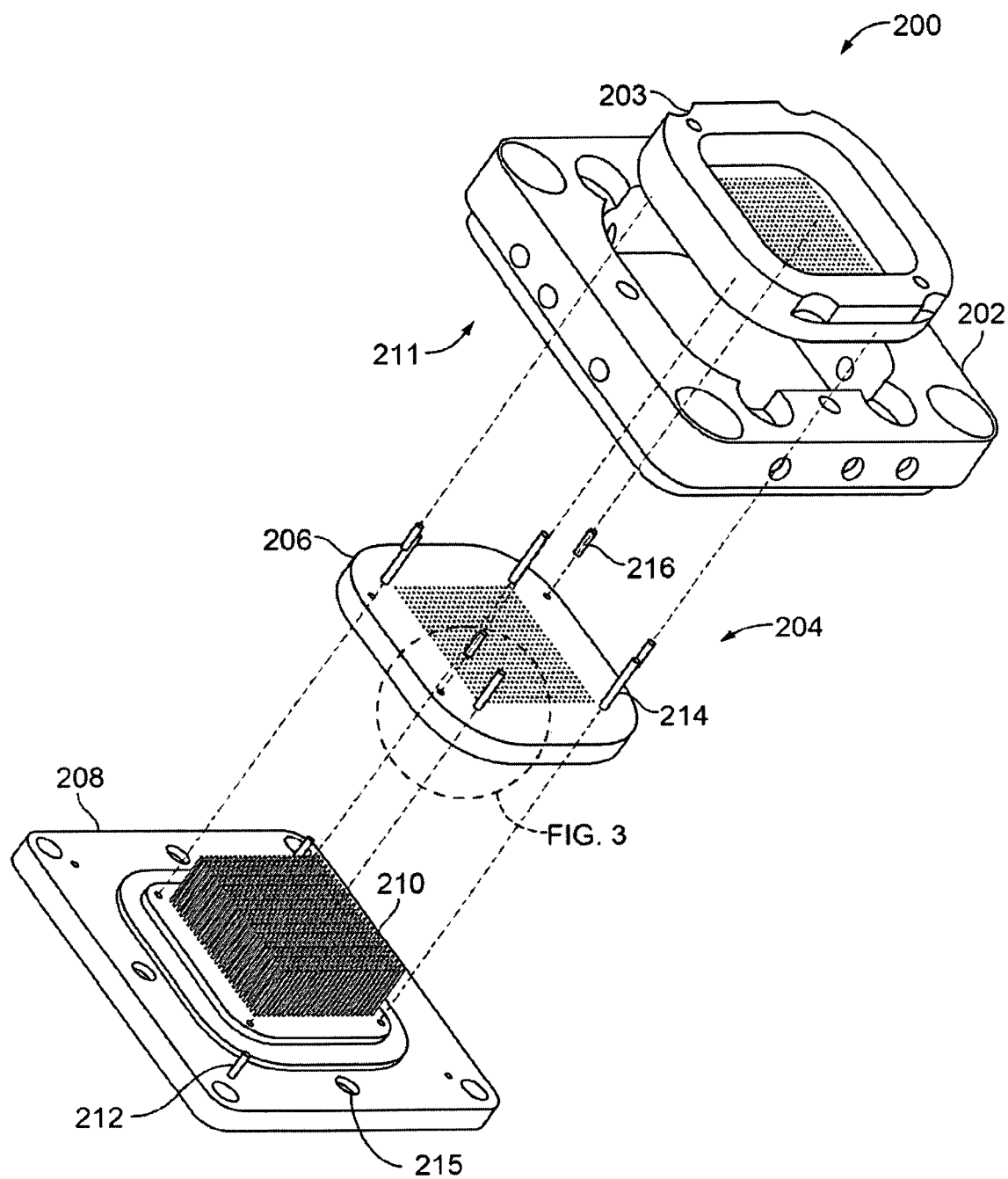
FIG. 2 is an exploded view of an integrated circuit socket apparatus, in accordance with one embodiment.

FIG. 2 is an exploded view of an integrated circuit socket apparatus 200, in accordance with one embodiment. As shown, included is a body 202 capable of receiving an integrated circuit (not shown) including a plurality integrated circuit contacts. In the context of the present description, such integrated circuit may include a graphics processor, a central processor, and/or any other integrated circuit, for that matter. In one embodiment, the integrated circuit socket apparatus 200 may be adapted for use in testing the integrated circuit. Of course, however, other different uses are contemplated, as well.

In one possible embodiment, the body 202 may further include a top recess for receiving a top adapter assembly 203 for being positioned between the integrated circuit and the body 202. Of course, while the integrated circuit socket apparatus 200 is shown in the present embodiment to include the top adapter assembly 203, embodiments are contemplated without such componentry.

Further provided is a bottom adapter assembly 204 removably coupled to the body 202. The bottom adapter assembly 204 includes a top portion 206 and a bottom portion 208. As an option, the top adapter assembly 203 may be spring loaded. For example, a plurality of (e.g. four, etc.) springs 216 may be positioned between the top adapter assembly 203 and the top portion 206 of the bottom adapter assembly 204 in the manner shown, such that the top adapter assembly 203 is capable of moving between an unbiased orientation somewhat distant from the body 202 and a biased orientation more proximal to the body 202. In use, the top adapter assembly 203 may be replaced for accommodating different integrated sizes and/or pin configurations.

Further, a plurality of pins 210 are removably situated between the top portion 206 and the bottom portion 208 of the bottom adapter assembly 204 for providing electrical communication between the integrated circuit contacts and a plurality of circuit board contacts (not shown). As shown, both the top portion 206 and the bottom portion 208 of the bottom adapter assembly 204 are equipped with full rows and columns of pin holes for allowing the pins 210 to pass therethrough. In one possible embodiment, the pins 210 may be spring loaded in that a length thereof is adjustable (e.g. using a spring loaded piston-type design, etc.).

As shown, at least part of the top portion 206 of the bottom adapter assembly 204 forms a protrusion that is received in a bottom recess 211 of the body 202. As will soon become apparent, such structure may, in some embodiments, reduce an overall profile of the integrated circuit socket apparatus 200.

As mentioned earlier, the bottom adapter assembly 204 is removably coupled to the body 202. To accomplish this, a plurality of posts 212 are frictionally coupled between a plurality of holes of the bottom portion 208 of the bottom adapter assembly 204, and a plurality of holes of the body 202. In various embodiment, such posts 212 may take the form of rigid cylinders with a circular cross-section, be rectangular in form, etc. Further, the posts 212 may, in other embodiments, be fixedly coupled to one of the foregoing components and thus rely on a frictional coupling with the remaining components.

While not shown, in one embodiment, a number of the posts 212 may extend through and past the holes of the bottom portion 208 of the bottom adapter assembly 204, thus allowing use of such exposed portions of the posts 212 to align the socket apparatus 200 to a circuit board (not shown), in a manner that will soon be set forth. Also not shown is a plurality of unillustrated screws which may be adapted for passing through the bottom of the bottom adapter assembly 204 through a plurality of additional apertures 215 formed therein for threadedly engaging with the top adapter assembly 203, so as to provide a more secure/permanent engagement of such components.

Still yet, a coupler is provided which is capable of coupling the top portion 206 and the bottom portion 208 of the bottom adapter assembly 204 when the bottom adapter assembly 204 is removed from the body 202. Such removal may be effected, for example, by disengaging the aforementioned frictional coupling provided by the posts 212. In use, the coupler is capable of coupling the top portion 206 and the bottom portion 208 of the bottom adapter assembly 204, for the purpose of preventing inadvertent removal of the pins 210.

In some embodiments, such removal of the bottom adapter assembly 204 may be for accommodating a different contact pitch of another integrated circuit. In particular, a plurality of the bottom adapter assemblies 204 may be provided each with a different contact pitch, for being removably coupled to the body 202 for accommodating different contact pitches of different integrated circuits. In the context of the present description, such contact pitch ma refer to a distance between contacts of the integrated circuit. To this end, each of the different bottom adapter assemblies 204 may include a plurality of holes that are spaced apart a different distance such that, when the pins 210 are inserted therein, they are, in turn, spaced to accommodate the appropriate contact pitch.

In different embodiments, the coupler may take a variety of forms. For example, in one embodiment, the coupler may include one or more fasteners 214 that are frictionally coupled between one or more holes of the top portion 206 and the bottom portion 208 of the bottom adapter assembly 204. Similar to the aforementioned posts 212, the fasteners 214 may take the form of rigid cylinders with a circular cross-section, be rectangular in form, etc. FIG. 3 illustrates a close-up view of the fasteners 214 in relation to the top portion 206 of the bottom adapter assembly 204.

Further, in various optional embodiments, the fasteners 214 may be fixedly coupled to the top portion 206 or the bottom portion 208 of the bottom adapter assembly 204, and thus rely on a frictional coupling with the remaining component. Of course, the coupler may include any structure that is capable of coupling the top portion 206 and the bottom portion 208 of the bottom adapter assembly 204 when the bottom adapter assembly 204 is removed from the body 202.

In one example of use, a first bottom adapter assembly with a first contact pitch may be removed from the body. Further, a top portion and a bottom portion of the first bottom adapter assembly may be separated for removing the pins. Next, the pins may be inserted between a top portion and a bottom portion of a second bottom adapter assembly with a second contact pitch. Thereafter, the second bottom adapter assembly may, in turn, be attached to the body to accommodate an integrated circuit with a different contact pitch. To this end, the bottom adapter assembly may be easily replaced and the pins may be reused as desired.

FIG. 4 is a partially exploded view of the integrated circuit socket apparatus 200 of FIG. 2 showing the top portion 206 and the bottom portion 208 of the bottom adapter assembly 204 coupled, in accordance with one embodiment. As shown, the fasteners 214 are inserted and frictionally engaged with each of the corresponding holes formed in the top portion 206 and the bottom portion 208 of the bottom adapter assembly 204. To this end, the pins 210 are constrained between the top portion 206 and the bottom portion 208 of the bottom adapter assembly 204 such that ends of the pins 210 are exposed beneath a lower surface of the bottom portion 208 (for electrical communication with circuit board contacts) and above an upper surface of the top portion 206 (for electrical communication with integrated circuit contacts).

FIG. 5 is an assembled view of the integrated circuit socket apparatus 200 of FIG. 2 showing the bottom adapter assembly 204 attached to the body 202, in accordance with one embodiment. As shown, the posts 212 are inserted and frictionally engaged with each of the corresponding holes formed in the bottom portion 208 of the bottom adapter assembly 204, as well as the holes formed in the body 202. To this end, the bottom adapter assembly 204 and the body 202 are attached for providing a unitary mechanism adapted for receiving the integrated circuit.

Figure 6:
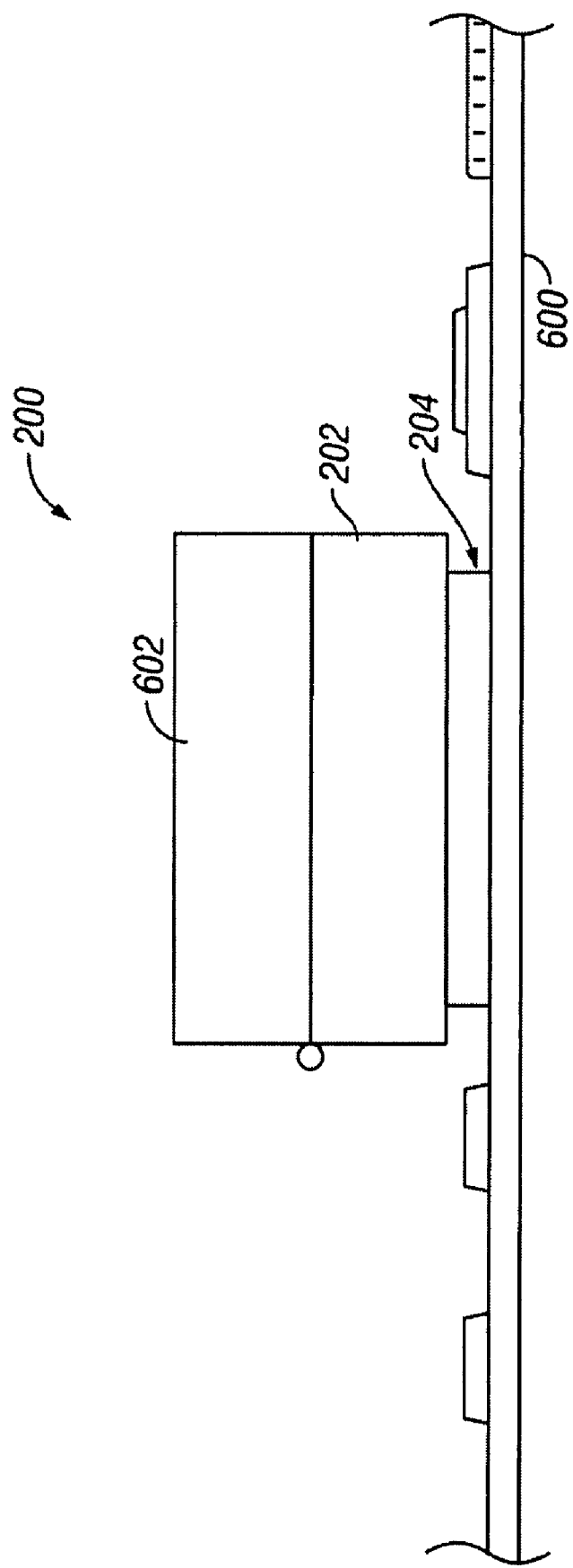
FIG. 6 illustrates one exemplary environment in which the integrated circuit socket apparatus of FIG. 2 may be used, in accordance with one embodiment.

FIG. 6 illustrates one exemplary environment in which the integrated circuit socket apparatus 200 of FIG. 2 may be used, in accordance with one embodiment. As shown, the bottom adapter assembly 204 of the integrated circuit socket apparatus 200 is attached to a circuit board 600 such that the pins 210 are in electrical communication with circuit board contacts positioned thereunder. In one embodiment, the bottom adapter assembly 204 of the integrated circuit socket apparatus 200 may be screwably coupled to the circuit board 600.

With continuing reference to FIG. 6, a cover 602 is provided for securing the integrated circuit in the body 202. In one embodiment, the cover 602 may be hingeably coupled to the body 202. As yet another option, the cover 602 may be both removably and hingeably coupled to body 202. Such removable nature may allow the cover 602 to be hingeably coupled to a desired side of the body 202 which may, in turn, accommodate various structures that are positioned on the circuit board 600.

Figure 7:
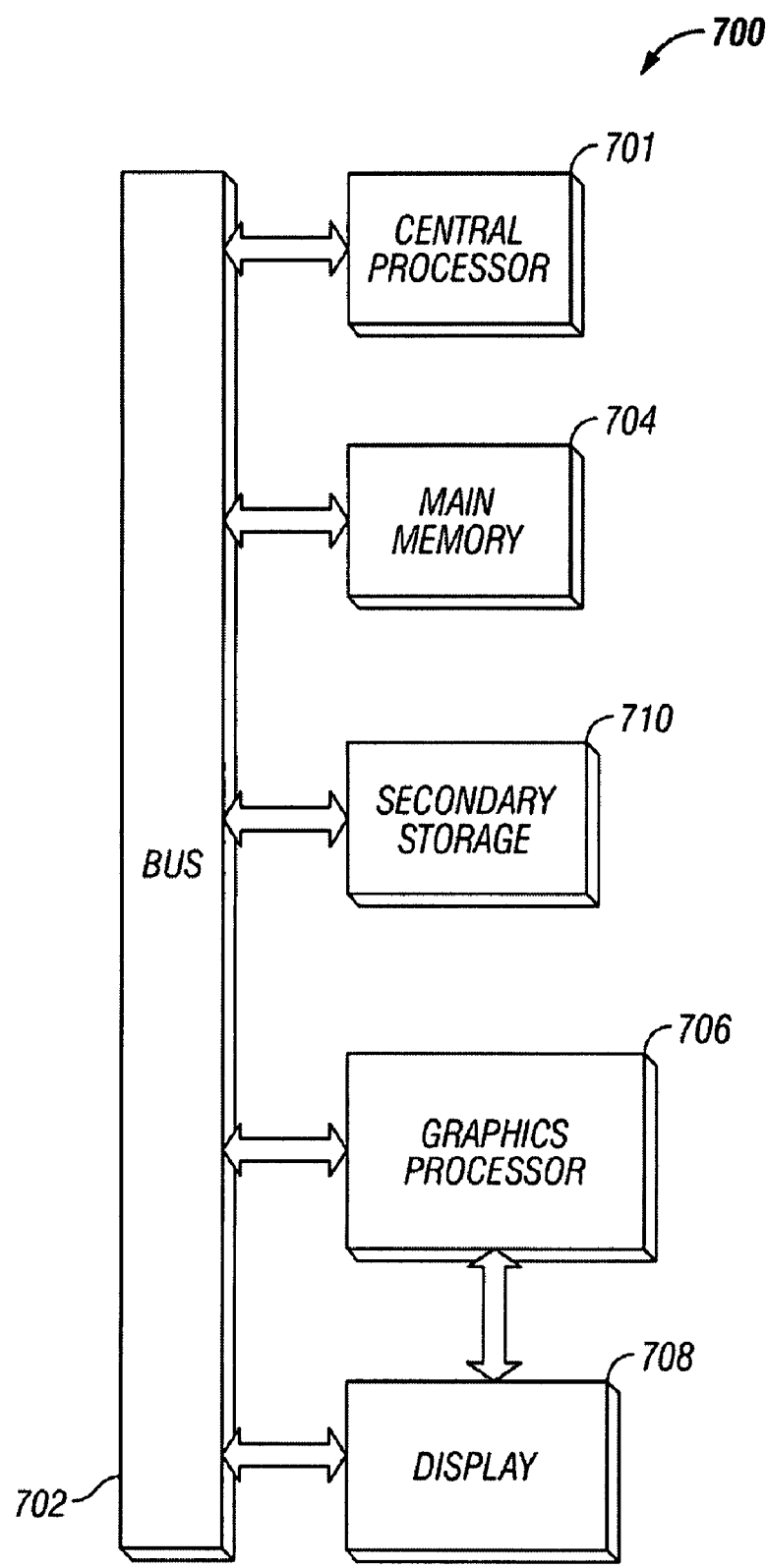
FIG. 7 illustrates an exemplary system in which the various architecture and/or functionality of the various previous embodiments may be implemented.

FIG. 7 illustrates an exemplary system 700 in which the various architecture and/or functionality of the various previous embodiments may be implemented. In one embodiment, the system 700 may represent one exemplary system with which the aforementioned circuit board 600 of FIG. 6 may be incorporated, such that the integrated circuit socket apparatus 200 of FIG. 2 may be used to test various integrated circuits.

As shown, a system 700 is provided including at least one host processor 701 which is connected to a communication bus 702. The system 700 also includes a main memory 704. Control logic (software) and data are stored in the main memory 704 which may take the form of random access memory (RAM).

The system 700 also includes a graphics processor 706 and a display 708, i.e. a computer monitor. In one embodiment, the graphics processor 706 may include a plurality of shader modules, a rasterization module, etc. Each of the foregoing modules may even be situated on a single semiconductor platform to form a graphics processing unit (GPU).

In the present description, a single semiconductor platform may refer to a sole unitary semiconductor-based integrated circuit or chip. It should be noted that the term single semiconductor platform may also refer to multi-chip modules with increased connectivity which simulate on-chip operation, and make substantial improvements over utilizing a conventional central processing unit (CPU) and bus implementation. Of course, the various modules may also be situated separately or in various combinations of semiconductor platforms per the desires of the user.

The system 700 may also include a secondary storage 710. The secondary storage 710 includes, for example, a hard disk drive and/or a removable storage drive, representing a floppy disk drive, a magnetic tape drive, a compact disk drive, etc. The removable storage drive reads from and/or writes to a removable storage unit in a well known manner.

Computer programs, or computer control logic algorithms, may be stored in the main memory 704 and/or the secondary storage 710. Such computer programs, when executed, enable the system 700 to perform various functions. Memory 704, storage 710 and/or any other storage are possible examples of computer-readable media.

In one embodiment, the architecture and/or functionality of the various previous figures may be implemented in the context of the host processor 701, graphics processor 706, an integrated circuit (not shown) that is capable of at least a portion of the capabilities of both the host processor 701 and the graphics processor 706, a chipset (i.e. a group of integrated circuits designed to work and sold as a unit for performing related functions, etc.), and/or any other integrated circuit for that matter.

Still yet, the architecture and/or functionality of the various previous figures may be implemented in the context of a general computer system, a circuit board system, a game console system dedicated for entertainment purposes, an application-specific system, and/or any other desired system. For example, the system 700 may take the form of a desktop computer, lap-top computer, and/or any other type of logic. Still yet, the system 700 may take the form of various other devices in including, but not limited to a personal digital assistant (PDA) device, a mobile phone device, a television, etc.

Further, while not shown, the system 700 may be coupled to a network [e.g. a telecommunications network, local area network (LAN), wireless network, wide area network (WAN) such as the Internet, peer-to-peer network, cable network, etc.) for communication purposes.

While various embodiments have been described above, it should be understood that they have been presented by way of example only, and not limitation. Thus, the breadth and scope of a preferred embodiment should not be limited by any of the above-described exemplary embodiments, but should be defined only in accordance with the following claims and their equivalents.

What is claimed is:

1. A method, comprising:
    providing an integrated circuit socket apparatus including:
        a body capable of receiving an integrated circuit including a plurality integrated circuit contacts; and
        a plurality of a bottom adapter assemblies removably coupleable to the body, each of the bottom adapter assemblies having a different contact pitch, for being removably coupled to the body for accommodating different contact pitches of different integrated circuits;
    removing a first one of the bottom adapter assemblies with a first contact pitch;
    separating a top portion and a bottom portion of the first bottom adapter assembly and removing a plurality of pins; and
    replacing the first bottom adapter assembly with a second one of the bottom adapter assemblies with a second contact pitch, and further comprising inserting the pins between the top portion and the bottom portion of the second bottom adapter assembly.

2. The method of claim 1, wherein the top portion and the bottom portion of the first bottom adapter assembly are separably coupled via a coupler when the first bottom adapter assembly is removed from the body for being configured in a first un-separated orientation for supporting the plurality of pins, and further for being configured in a second separated orientation for removing the plurality of pins.

3. The method of claim 2, wherein the coupler is capable of coupling the top portion and the bottom portion of the first bottom adapter assembly when the bottom adapter assembly is removed from the body, for preventing inadvertent removal of the plurality of pins.

4. The method of claim 2, wherein the coupler includes at least one fastener that is frictionally coupled between at least one hole of the top portion of the first bottom adapter assembly.

5. The method of claim 2, wherein the coupler includes at least one fastener that is frictionally coupled to at least one hole of the bottom portion of the first bottom adapter assembly.

6. The method of claim 2, wherein the coupler includes a plurality of fasteners that are frictionally coupled between a plurality of holes of the top portion of the first bottom adapter assembly and a plurality of holes of the bottom portion of the first bottom adapter assembly.

7. The method of claim 1, wherein a top portion and a bottom portion of each of the bottom adapter assemblies are separably coupled via a coupler.

8. The method of claim 1, wherein at least part of the top portion of the first bottom adapter assembly forms a protrusion that is received in a recess of the body.

9. The method of claim 1, wherein at least part of the top portion of the first bottom adapter assembly forms a protrusion that is received in a recess of the body, for reducing a profile of the integrated circuit socket apparatus.

10. The method of claim 1, wherein a top adapter assembly is positioned between the integrated circuit and the body.

11. The method of claim 10, wherein the top adapter assembly is spring loaded.

12. The method of claim 1, wherein a cover is provided for securing the integrated circuit in the body.

13. The method of claim 12, wherein the cover is hingeably coupled to the body.

14. The method of claim 12, wherein the cover is removably and hingeably coupled to the body for being hingeably coupled to any one of a plurality of sides of the body.

15. The method of claim 1, wherein the plurality of pins is spring loaded.

16. The method of claim 1, wherein the integrated circuit socket apparatus is adapted for use in testing the integrated circuit.

17. The method of claim 1, wherein the plurality of pins are removably situated between the top portion and the bottom portion of the first bottom adapter assembly for providing electrical communication between the integrated circuit contacts and a plurality of circuit board contacts.

* * * * *